United States Patent
Hsu et al.

(10) Patent No.: US 7,633,165 B2
(45) Date of Patent: Dec. 15, 2009

(54) INTRODUCING A METAL LAYER BETWEEN SIN AND TIN TO IMPROVE CBD CONTACT RESISTANCE FOR P-TSV

(75) Inventors: Kuo-Ching Hsu, Chung-Ho (TW); Chen-Shien Chen, Zhuebi (TW); Boe Su, Chiayi (TW); Hon-Lin Huang, Hsinchu (TW)

(73) Assignee: Taiwan Semiconductor Manfacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/206,349

(22) Filed: Sep. 8, 2008

(65) Prior Publication Data

US 2009/0160061 A1 Jun. 25, 2009

Related U.S. Application Data

(60) Provisional application No. 61/016,220, filed on Dec. 21, 2007.

(51) Int. Cl.
*H01L 23/48* (2006.01)

(52) U.S. Cl. .......... 257/763; 257/737; 257/748; 257/750; 257/758; 257/774; 257/E21.476

(58) Field of Classification Search .......... 257/748; 438/628, 644, 677

See application file for complete search history.

(56) References Cited

U.S. PATENT DOCUMENTS 7,399,706 B2 * 7/2008 Omoto et al. .......... 438/687

* cited by examiner

*Primary Examiner*—N Drew Richards
*Assistant Examiner*—Kyoung Lee
(74) *Attorney, Agent, or Firm*—Haynes and Boone, LLP

(57) ABSTRACT

The present disclosure provide an integrated circuit. The integrated circuit includes a through-silicon-via (TSV) trench configured in a semiconductor substrate; a conductive pad formed on the semiconductor substrate, the conductive pad being adjacent the TSV trench; a silicon nitride layer disposed over the conductive pad and in the TSV trench; a titanium layer disposed on the silicon nitride layer; a titanium nitride layer disposed on the titanium layer; and a copper layer disposed on the titanium nitride layer.

18 Claims, 6 Drawing Sheets

US 7,633,165 B2

INTRODUCING A METAL LAYER BETWEEN SIN AND TIN TO IMPROVE CBD CONTACT RESISTANCE FOR P-TSV

CROSS REFERENCE

This application claims the benefit of U.S. Provisional Application 61/016,220 entitled "THROUGH-SILICON VIA," filed Dec. 21, 2007, herein incorporated by reference in its entirety.

BACKGROUND

In semiconductor technologies, a through-silicon via (TSV) is a conductive feature formed in a semiconductor substrate (wafer or die). The TSV feature vertically passes through the semiconductor substrate, providing a stacked wafer/die packaging method. The TSV is also referred to as a 3-D packaging technology. However, the present scheme for post-TSV faces high CBD contact resistance during wafer acceptance test (WAT) characterization and degrades copper pad adhesion, causing quality and reliability issues and failing the customer requirements.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
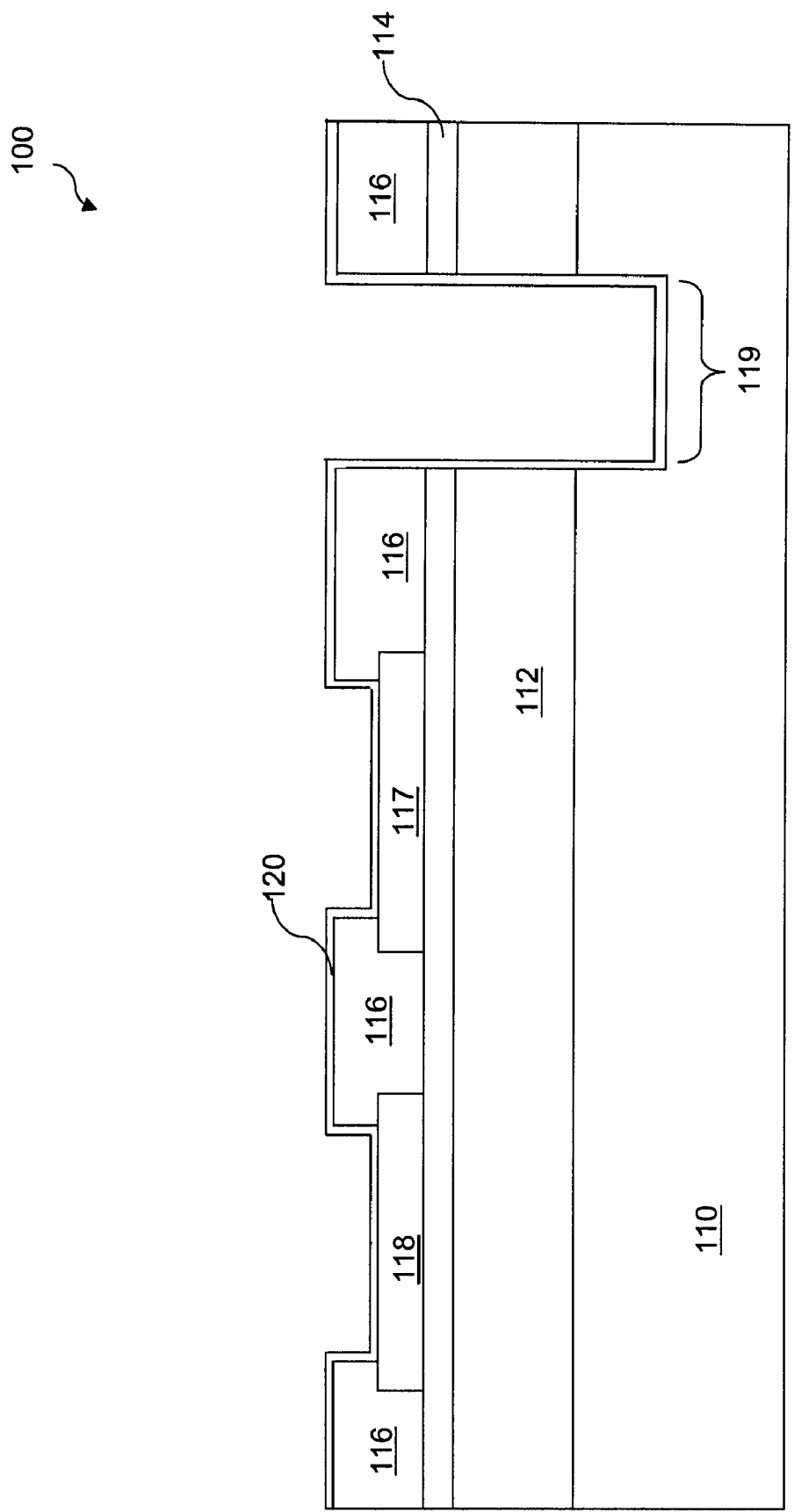
FIGS. 1 through 6 are sectional views of various embodiments of an integrated circuit during different fabrication stages and constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1 through 6 are sectional views of various embodiments of an integrated circuit during different fabrication stages and constructed according to aspects of the present disclosure. With reference to FIGS. 1 through 6, an integrated circuit 100 and a method making the same are collectively described. Referring to FIG. 1, the integrated circuit 100 includes a semiconductor substrate 110. In one example, the semiconductor substrate is a semiconductor wafer. In another example, the semiconductor substrate includes a semiconductor chip. In the present embodiment, the semiconductor substrate 110 includes silicon. The substrate 110 may alternatively or additionally include other elementary semiconductor, such as germanium. The substrate 110 may also include a compound semiconductor, such as silicon carbide, gallium arsenic, indium arsenide, and indium phosphide.

The semiconductor substrate 110 may include an epitaxial layer. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may includes a semiconductor-on-insulator (SOI) structure. In various examples, the substrate includes a buried oxide (BOX) layer formed by a process such as separation by implanted oxygen (SIMOX). The substrate 110 includes various doped wells and other doped features configured and coupled to form various microelectronic devices such as metal-insulator-semiconductor field effect transistor (MOSFET) including complementary MOSFET (CMOS), imaging sensor including CMOS imaging sensor (CIS), micro-electro-mechanical system (MEMS), and/or other suitable active and/or passive devices. The doped wells and other doped features include p-type doped region and/or an n-type doped region, formed by a doping process such as ion implantation. Other structures such as gate dielectric and polysilicon gate electrodes may be additionally formed on the substrate for devices such as MOSFET device. The substrate 110 also includes various isolation features configured to separate various devices from each other for proper isolation. The isolation features may include different structures and can be formed by a particular processing technologies. In one example, the isolation features include dielectric isolation such as shallow trench isolation (STI). The STI can be fabricated by etching the substrate to form a trench and filling the trench with a dielectric material.

The integrated circuit 100 also includes an interconnect structure 112 formed on the semiconductor substrate 110 and configured to properly connect various doped regions in the substrate, resulting in the integrated circuit with designed functions. In present embodiment, the interconnect structure includes multilayer interconnect (MLI) having horizontal conductive features (metal lines) disposed at multiple metal layers and vertical conductive features, such as contacts and vias. A via is configured to connect two metal lines at different metal layers. A contact is configured to connect a metal line and the substrate. The multilayer interconnect may include conductive materials such as aluminum, aluminum/silicon/copper alloy, titanium, titanium nitride, tungsten, polysilicon, metal silicide, or combinations in aluminum interconnect. Aluminum interconnect can be formed by a process including physical vapor deposition (PVD or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide to reduce contact resistance. Alternatively, a copper interconnect may be used. Copper interconnect may include copper, copper alloy, titanium, titanium nitride, tantalum, tantalum nitride, tungsten, polysilicon, metal silicide, or combinations. The copper interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The semiconductor device 100 further includes dielectric material features disposed in the interconnect structure 112 to isolate the various conductive features. The dielectric material features include an interlayer dielectric (ILD) disposed between the substrate and the first metal layer. The dielectric material features also include inter-metal dielectric (IMD) disposed between adjacent metal layers. The dielectric material features include a dielectric material such as silicon oxide, silicon nitride, silicon oxynitride, or spin-on glass (SOG). The dielectric material alternatively includes a material of a low dielectric constant (low k) such as a dielectric constant less than about 3.5. In various examples, the dielectric material may include silicon dioxide, silicon nitride, silicon oxynitride, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric material features are formed by a technique including spin-on coating, CVD, or other suitable processes.

The integrated circuit 100 further includes a first passivation layer 114 formed on the interconnect structure 112 and a second passivation layer 116 formed on the first passivation layer 114. The first and second passivation layers each may include various passivation materials. In one embodiment, the first passivation layer 114 includes silicon oxide. In one example, the silicon oxide passivation layer 114 may have a thickness ranging between about 0.2 micron and about 2 micron. In another example, the silicon oxide passivation layer may be formed by a high density plasma CVD process. In another embodiment, the second passivation layer 116 includes silicon nitride and/or silicon oxynitride. In one example, the second passivation layer may have a thickness ranging between about 2 K angstrom and about 15 K angstrom. In one example, a silicon nitride passivation layer is formed by a plasma enhanced CVD (PECVD) process.

The integrated circuit 100 also includes one or more conductive pads, such as conductive pads 117 and 118, formed on the substrate. The conductive pads are configured overlying the interconnect structure 112 and are properly coupled with the interconnect structure 112. The conductive pads are disposed on the first passivation layer 114 and positioned at least partially within the openings of the second passivation layer 116. In one example, the conductive pads includes aluminum. In one embodiment of the pad formation, an aluminum layer is deposited on the first passivation layer and within the openings of the first passivation layer to connect to the interconnect structure. The aluminum layer is then patterned to form the various conductive pads, such as the pads 117 and 118. The second passivation layer 116 is deposited on the first passivation layer 114 and the pads, and is then patterned to expose the pads (e.g. 117 and 118).

The integrated circuit 100 further includes various material layers formed on the conductive pads and the second passivation layer 116 in stack as described below. The integrated circuit 100 also includes a through-silicon via (TSV) 119 formed on and in the semiconductor substrate 110, in one embodiment. The TSV 119 is a vertical trench and passes through the semiconductor substrate and is exposed from the backside of the semiconductor substrate 110 for 3-D packaging at a later processing stage such as a backside polishing process to thin the substrate and expose the trench from the backside of the semiconductor substrate and to be coupled to other wafer/chip with the filled conductive material. In one example, wafers and/or chips can be stacked vertically and coupled through a plurality of filled TSV features such as TSV feature 119. Such TSV 3D package creates vertical connections through chip body, eliminates additional wire and can also be flatter than an edge-wired 3D package. The TSV 119 may be formed by a process similar to a process to form shallow trench isolation but with a larger depth.

A silicon oxide (SiOX) layer 120 is formed on the conductive pads, the though-silicon via 119 and the second passivation layer 116, as illustrated in FIG. 1. The silicon oxide layer 120 may include tetraethoxysilane (TEOS) or silica glass. The silicon oxide layer may have a thickness ranging between about 3 k and 5 k angstrom.

Figure 2:
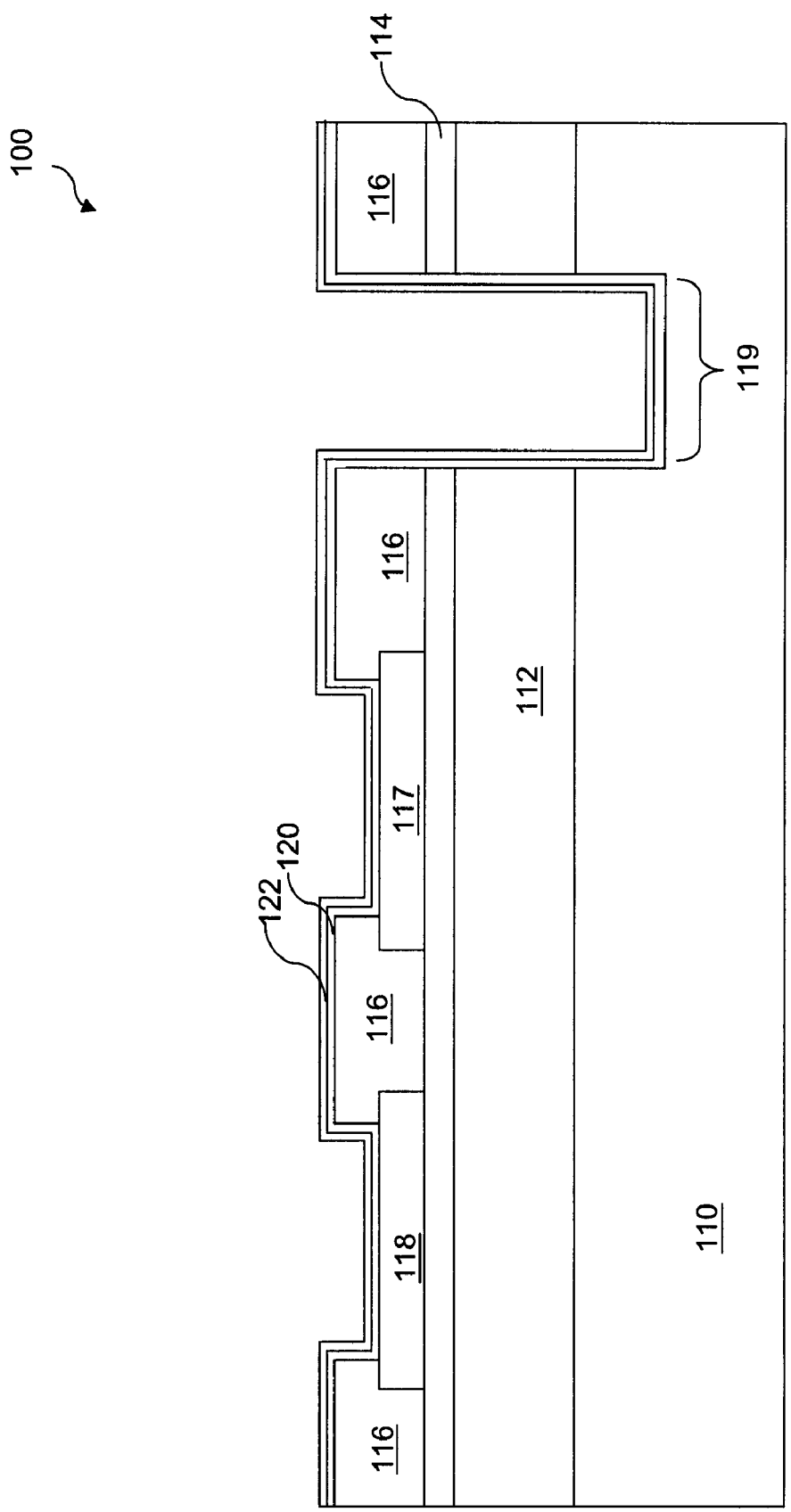

Referring to FIG. 2, a silicon nitride (SiN) layer 122 is formed on the silicon oxide layer 120. In one example, the silicon nitride layer 122 may have a thickness ranging between about 3 k and 5 k angstrom. The silicon nitride layer 122 may be formed by a CVD technique. In one example, the precursors used to form silicon nitride in CVD includes Hexachlorodisilane ($Si_2Cl_6$), Dichlorosilane ($SiH_2Cl_2$), Bis(TertiaryButylAmino)Silane ($C_8H_{22}N_2Si$), and Disilane ($Si_2H_6$).

Figure 3:
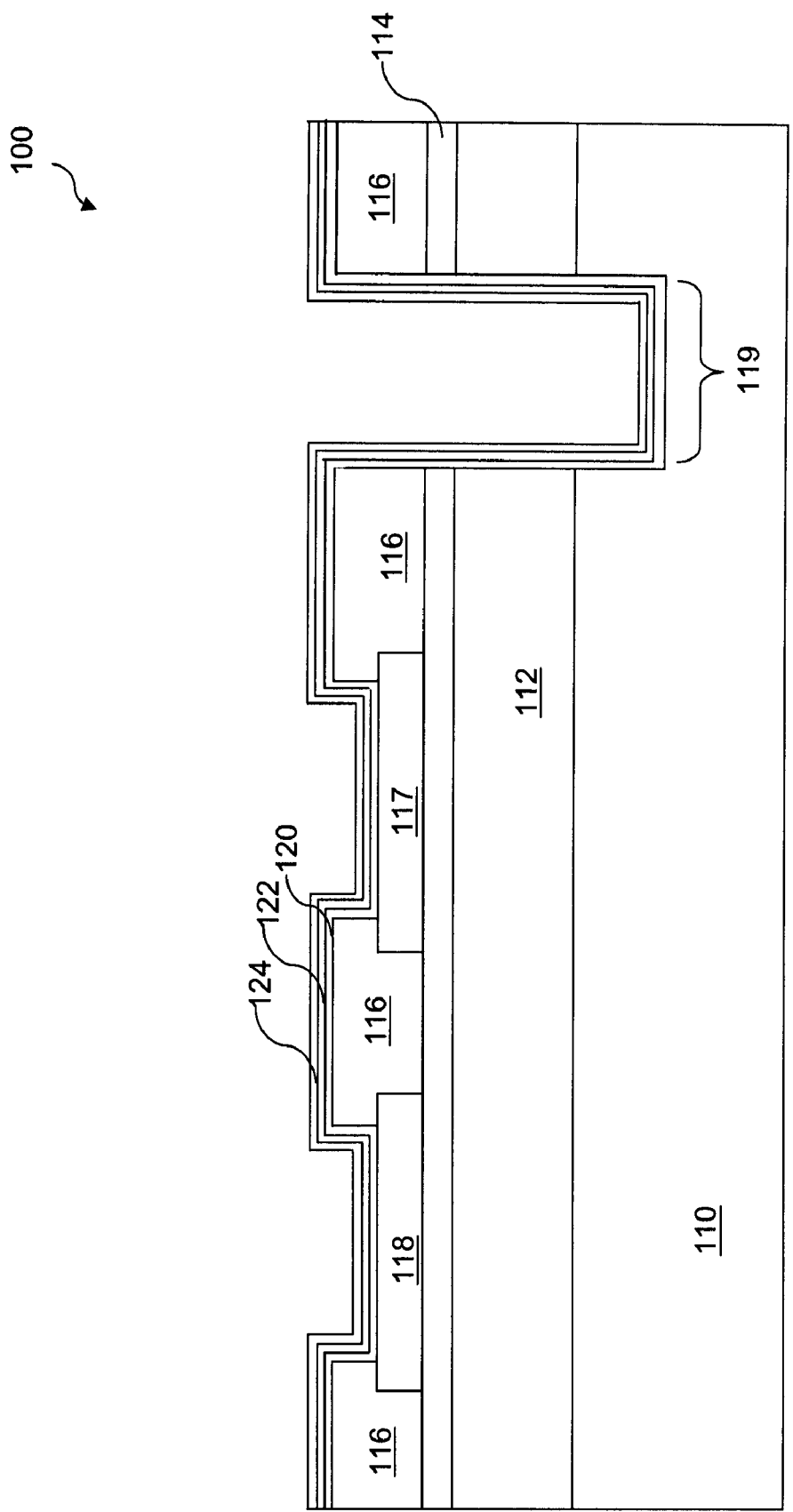

Referring to FIG. 3, a metal layer is introduced and formed on the silicon nitride layer 122. In one example, a titanium (Ti) layer 124 is formed on the silicon nitride layer 122. The titanium layer 124 is formed by PVD. In another example, the titanium layer 124 may be alternatively formed by an ion metal plasma (IMP) technique, also referred to as Ionized PVD (I-PVD). The IMP technique involves remote formation of a vaporized metal beam that includes ionized species. In one example, the titanium layer 124 has a thickness ranging between about 500 and 1200 angstrom. In another example, the titanium layer 124 has a thickness of about 900 angstrom.

Figure 4:
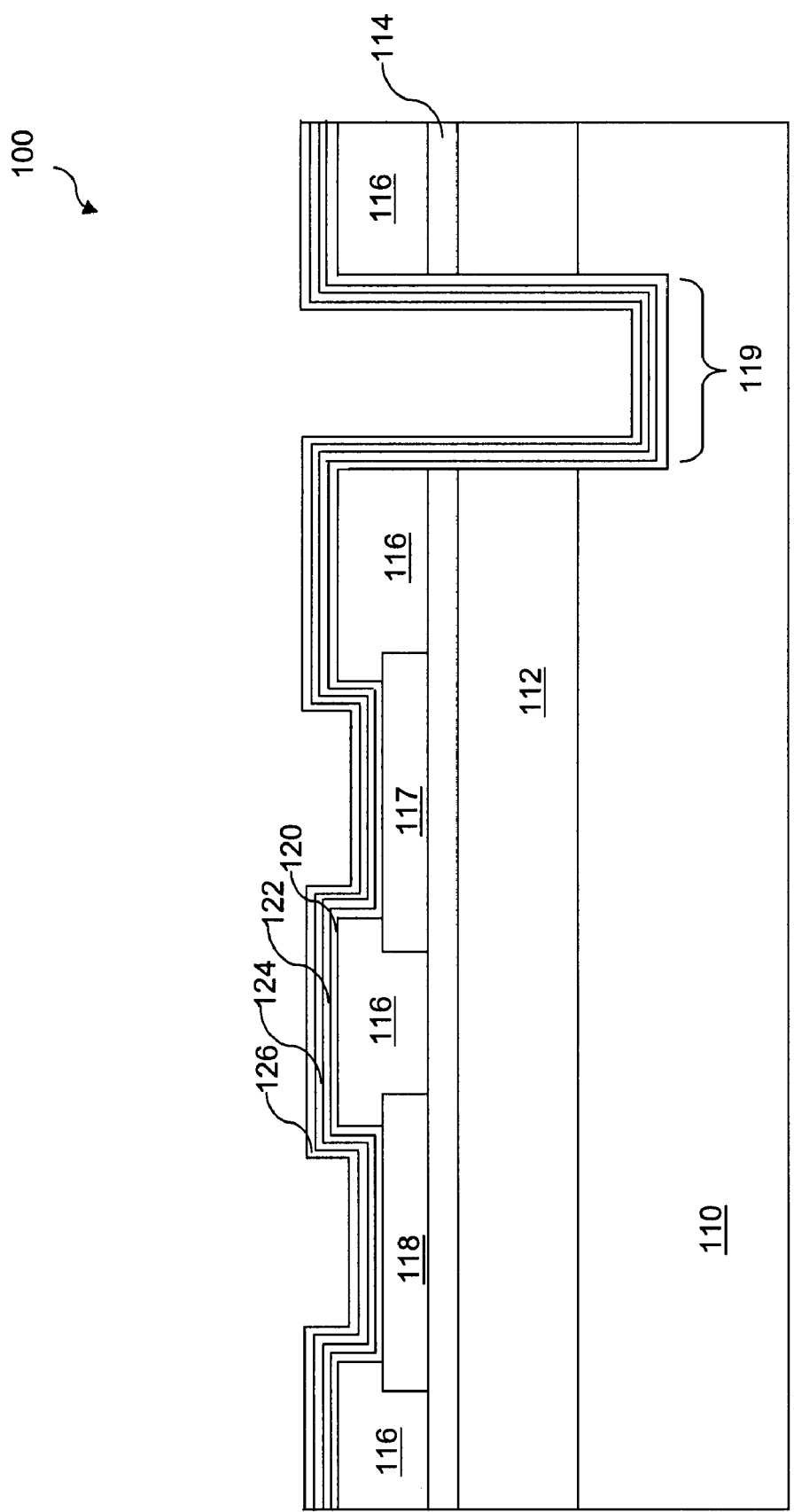

Referring to FIG. 4, a titanium nitride (TiN) layer 126 is formed on the titanium layer 124. In one example, the titanium nitride layer 126 has a thickness ranging between about 500 and 1200 angstrom. The titanium nitride layer 126 may be formed by a PVD process. For example, the titanium nitride layer is formed by sputtering, using a titanium target and nitrogen as a reactive gas.

Figure 5:
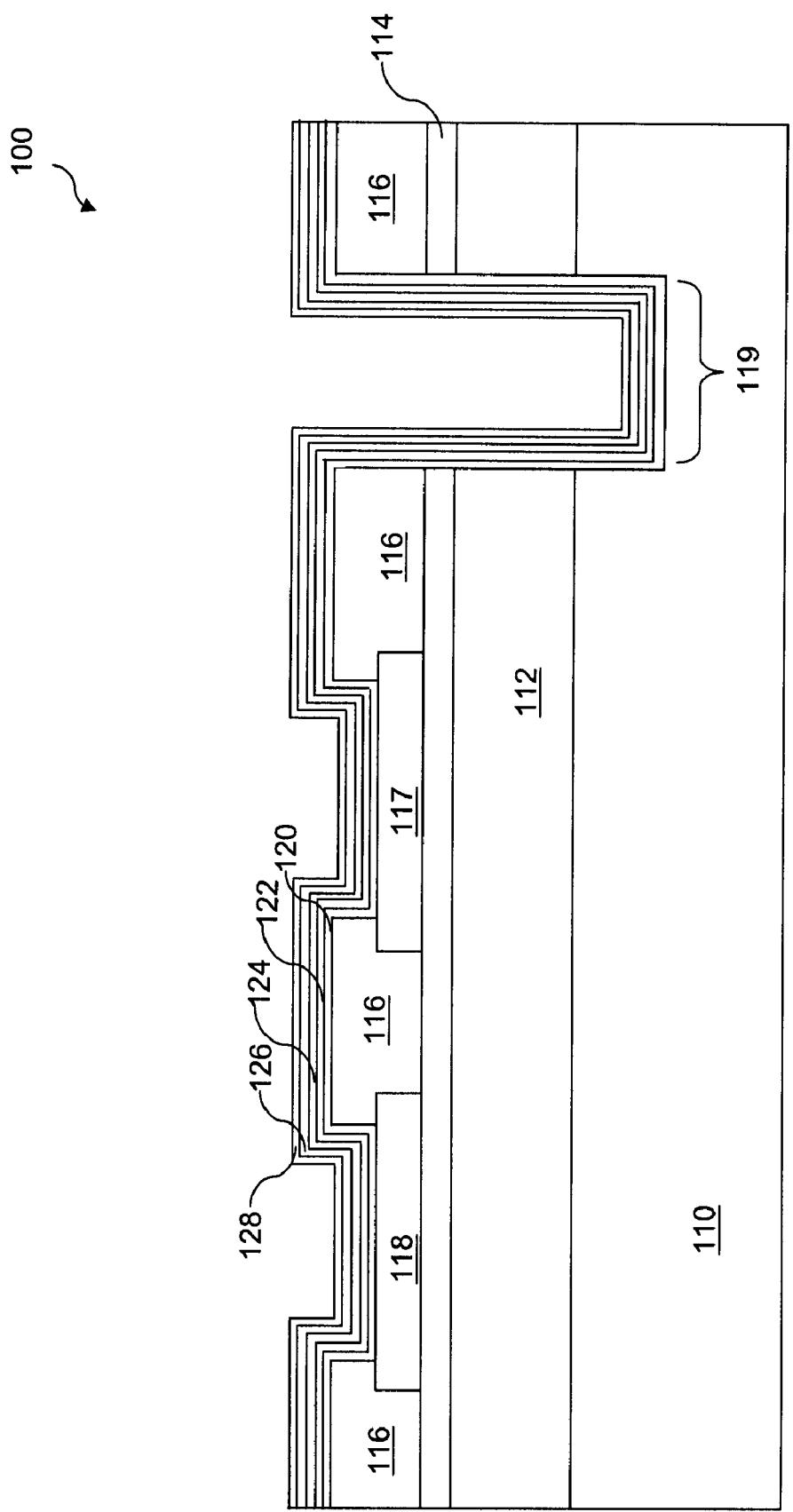

Referring to FIG. 5, the integrated circuit 100 also includes a copper (Cu) seed layer 128 formed by PVD. For example, the copper seed layer is formed by sputtering. In one example, the copper seed layer 128 has a thickness ranging between about 1 micron and about 3 micron. In another example, the copper seed layer 128 has a thickness of about 2 micron. In one embodiment, an annealing process may be implemented to improve the adhesions between adjacent material layers, such as the adhesion between the titanium layer and the titanium nitride layer. The annealing process may be performed in a different processing sequence to achieve the similar purpose.

Figure 6:
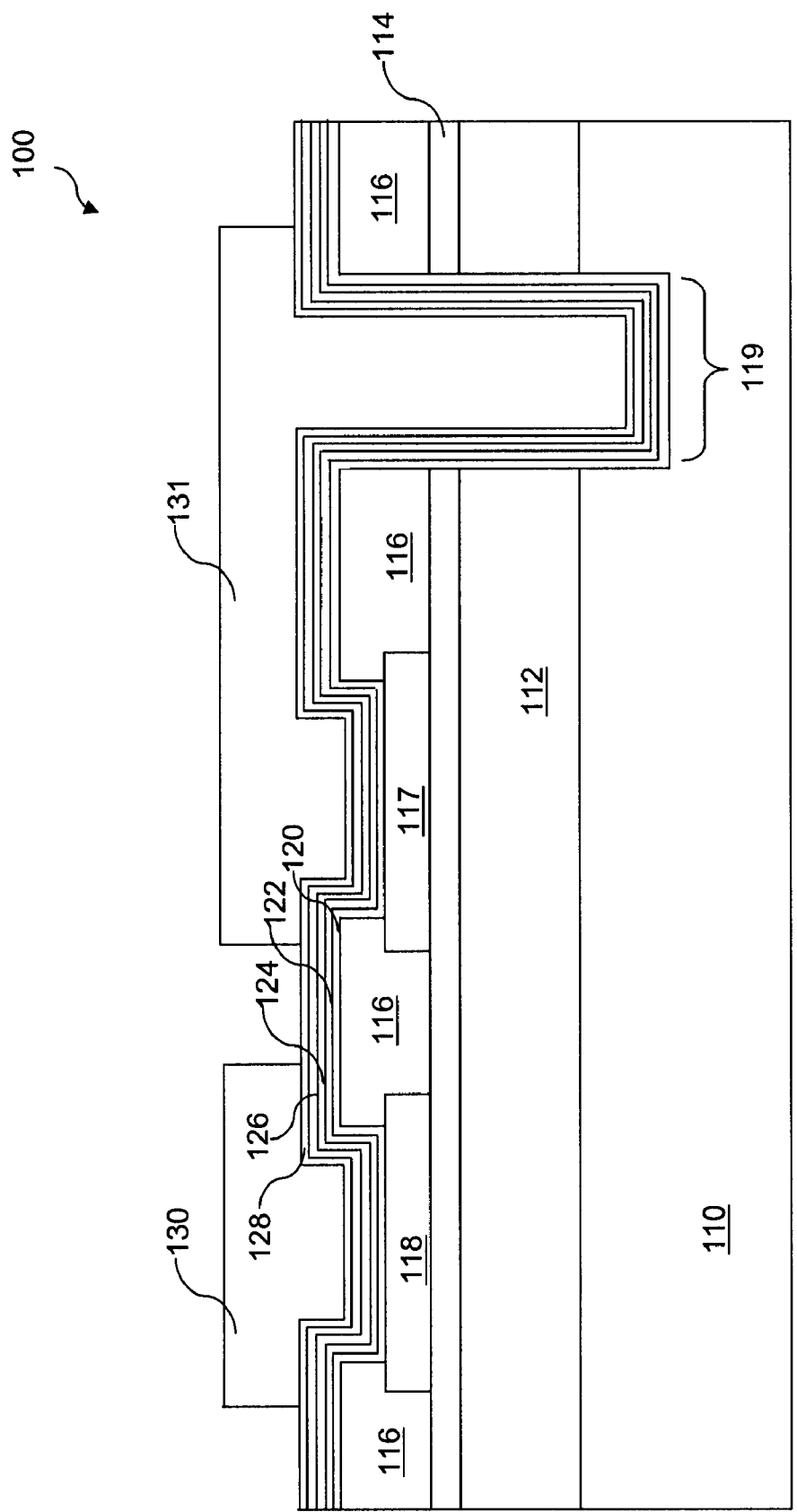

Referring to FIG. 6, the integrated circuit 100 further includes a metal layer, such as copper (Cu), formed on the cupper seed layer 128 by a suitable method such as plating. The copper layer substantially fills the recess of the second passivation layer 116. Other process may be further followed. For example, a chemical mechanic polishing (CMP) process may be applied thereafter to planarize the surface and remove the recess copper. The metal layer may be further patterned to form conductive features 130 and 131. For example, if a copper layer is implemented, then a damascene process is used to form patterned copper features 130 and 131.

The metal layer substantially fills in the through-silicon via (TSV) 119, forming a vertical conductive feature (also referred to as TSV if no misunderstanding). The TSV 119 passes through the semiconductor substrate and is exposed from the backside of the semiconductor substrate 110 for 3-D packaging. In one embodiment, the TSV 119 is connected to the conductive pad 117. In one example, wafers and/or chips can be stacked vertically and coupled through a plurality of TSV features such as TSV 119. Such TSV 3D package creates vertical connections through chip body and eliminates additional wire.

In present embodiment, the TSV 119 includes copper. In another embodiment, the TSV 119 includes a structure similar to dual damascene structure having a lining layer and copper inside. In another embodiment, the TSV 119 can be formed by a fabrication method similar to the dual damascene process, in which a trench is formed, copper is filled and chemical mechanical polishing (CMP) process is applied to remove excessive copper and planarize the surface. For example, a deep trench is formed in the interconnect structure and the semiconductor substrate by an etching process such as a dry plasma etching process. Copper is filled in the deep trench. In another example, the titanium layer 124 is formed in the TSV trench as well. The titanium nitride layer 126 is further formed on the titanium layer 124 in the TSV trench. The copper seed layer 128 is deposited on the titanium nitride layer in the TSV trench. Then a bulk copper layer is formed, using plating, on the Cu seeding layer and fills in the TSV trench. A CMP process is applied to polish the surface and remove the excessive copper. Furthermore, the semiconductor substrate 110 may be polished and/or etched from the backside such that the TSV 119 is exposed and may be further protruded for proper bonding. The TSV 119 may have different geometries and dimensions for enhanced performance in various embodiments.

In the integrated circuit 100 constructed according to aspects of the present disclosure, the titanium layer 124 interposed between the silicon nitride layer 122 and the titanium nitride layer 126 enhances the adhesion between the silicon nitride layer 122 and the titanium nitride layer 126, reduces the contact resistance, enlarges the process window, and/or prevents unnecessary alloy formation, reduces etching issues for under-bonding metal (UBM), in various embodiments.

The above integrated circuit 100 only represents one embodiment of the present disclosure. Proper modification, alternation and/or extension may be considered without departure from the spirit and the scope of the present disclosure. In another embodiment, a second titanium layer is formed between the titanium nitride layer and the copper layer to improve the adhesion therebetween and/or achieve other advantages. The second titanium layer interposed between the titanium nitride layer and the copper layer can be substantially similar to the titanium layer 124 in terms of formation and composition. The second titanium layer may enhance the adhesion between the titanium nitride layer and the copper layer, reduces the contact resistance, enlarges the process window, and/or prevents unnecessary alloy formation, reduces etching issues for under-bonding metal (UBM), in various examples. In other embodiment, the integrated circuit may include a plurality of TSV features configured for proper bonding and packaging.

The disclosed method may include additional and/or alternative processing steps. The disclosed integrated circuit may further include additional and/or alternative device features. For example, the conductive pads can be alternatively formed in the first passivation layer 114. In another embodiment, the passivation structure is reduced to include only one passivation layer. In another embodiment, the conductive pads may additionally or alternatively include other suitable metal or conductive alloy. In another example, the conductive features 130 and 131 includes lead-tin alloy. I another example, a reflow process may be applied to the conductive layer patterned for the conductive features 130 and 131.

Thus, the present disclosure provides an integrated circuit. The integrated circuit includes a through-silicon-via (TSV) feature formed in a semiconductor substrate; a conductive pad formed on the semiconductor substrate, the conductive pad being adjacent the TSV feature; a silicon nitride layer formed over the conductive pad; a titanium layer formed on the silicon nitride layer; a titanium nitride layer formed on the titanium layer; and a copper layer formed on the titanium nitride layer.

In various embodiments of the present disclosure, the integrated circuit may further include a first passivation layer formed on the semiconductor substrate. The integrated circuit may further include a second passivation layer formed on the first passivation layer and around sidewalls of the conductive pad. The integrated circuit may further include a multilayer interconnect (MLI) structure underlying the first passivation layer. One of the first and second passivation layers include silicon oxide. In another embodiment, one of the first and second passivation layers include silicon nitride. The integrated circuit may further include a silicon oxide layer interposed between the second passivation layer and the silicon nitride layer. The integrated circuit may further include a device selected from the group consisting of a transistor, an imaging sensor, micro-electro-mechanical system (MEMS) structure, capacitor, and combinations thereof. The conductive pad may include aluminum. The titanium layer may be formed by an ion metal plasma (IMP) technique. In another embodiment, the titanium layer is formed by a physical vapor deposition (PVD) technique. The titanium layer may be further annealed. The titanium layer may include a thickness ranging between about 500 angstrom and about 1200 angstrom. The copper layer further includes a copper seed layer formed by PVD technique; and a bulk copper formed on the cupper seed layer by plating. The integrated circuit may further include another titanium layer interposed between titanium nitride layer and the copper layer.

The present disclosure also provides another embodiment of an integrated circuit. The integrated circuit includes a first passivation layer formed on a substrate; a conductive pad formed on the first passivation layer; a second passivation layer formed on the first passivation layer and on sidewalls of the conductive pad; a silicon oxide layer formed on the conductive pad and the second passivation layer; a silicon nitride layer formed on the silicon oxide layer; a titanium layer formed on the silicon nitride layer; a titanium nitride layer formed on the titanium layer; and a copper seed layer formed on the titanium nitride layer. The integrated circuit may further include a second titanium layer interposed between titanium nitride layer and the copper layer. The integrated circuit may further include a bulk copper formed on the copper seed layer by plating.

The present disclosure also provides another embodiment of an integrated circuit. The integrated circuit includes a through-silicon-via (TSV) feature formed in a substrate; a conductive pad formed on the substrate; a silicon nitride layer formed on the conductive pad; a first titanium layer formed on the silicon nitride layer; a titanium nitride layer formed on the first titanium layer; a second titanium layer formed on the titanium nitride layer; and a copper layer formed on the second titanium layer. The integrated circuit may further include an interconnect structure formed on the substrate; and a passivation layer overlying the interconnect structure and underlying the conductive pad.

The present disclosure also provides a method of making a TSV device. In one embodiment, the method includes forming a through-silicon-via (TSV) formed in a semiconductor substrate; forming a conductive pad on the semiconductor substrate, the conductive pad being adjacent the TSV feature; forming a silicon nitride layer on the conductive pad; forming a first titanium layer on the silicon nitride layer; forming a titanium nitride layer on the first titanium layer; and forming a copper layer on the titanium nitride layer. The method may further include forming a second titanium layer between the titanium nitride layer and the copper layer. The method may further includes forming an interconnect structure on the semiconductor substrate and coupled with the conductive pad, and forming a passivation layer on the interconnect structure and adjacent sidewalls of the conductive pad.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An integrated circuit, comprising:
   a through-silicon-via (TSV) trench configured in a semiconductor substrate;
   a conductive pad formed on the semiconductor substrate, the conductive pad being adjacent the TSV trench;
   a silicon nitride layer disposed over the conductive pad and in the TSV trench;
   a titanium layer disposed on the silicon nitride layer;
   a titanium nitride layer disposed on the titanium layer; and
   a copper layer disposed on the titanium nitride layer.

2. The integrated circuit of claim 1, further comprising a first passivation layer interposed between the semiconductor substrate and the silicon nitride layer.

3. The integrated circuit of claim 2, further comprising a second passivation layer interposed between the first passivation layer and the silicon nitride layer.

4. The integrated circuit of claim 3, further comprising a silicon oxide layer interposed between the second passivation layer and the silicon nitride layer.

5. The integrated circuit of claim 3, wherein the first passivation layer comprises silicon oxide.

6. The integrated circuit of claim 3, wherein the second passivation layers comprises silicon nitride.

7. The integrated circuit of claim 1, further comprising a multilayer interconnect (MLI) structure configured on the semiconductor substrate, underlying the conductive pad first passivation layer, and coupled with the conductive pad.

8. The integrated circuit of claim 1, further comprising a device formed in the semiconductor substrate and selected from the group consisting of a transistor, an imaging sensor, micro-electro-mechanical system (MEMS) structure, capacitor, and combinations thereof.

9. The integrated circuit of claim 1, wherein the conductive pad comprises aluminum.

10. The integrated circuit of claim 1, wherein the titanium layer is formed by an ion metal plasma (IMP) technique.

11. The integrated circuit of claim 1, wherein the titanium layer is formed by a physical vapor deposition (PVD) technique.

12. The integrated circuit of claim 1, wherein the titanium layer is further annealed.

13. The integrated circuit of claim 1, wherein the titanium layer comprises a thickness ranging between about 500 angstrom and about 1200 angstrom.

14. The integrated circuit of claim 1, wherein the copper layer comprises:
    a copper seed layer formed by PVD technique; and
    a bulk copper formed on the cupper seed layer by plating.

15. The integrated circuit of claim 1, further comprising another titanium layer interposed between the titanium nitride layer and the copper layer.

16. An integrated circuit, comprising:
    a conductive pad disposed on a substrate;
    a passivation layer disposed on the substrate and on sidewalls of the conductive pad;
    a silicon oxide layer disposed on the conductive pad and the passivation layer;
    a silicon nitride layer disposed on the silicon oxide layer;
    a titanium layer disposed on the silicon nitride layer;
    a titanium nitride layer disposed on the titanium layer; and
    a copper layer disposed on the titanium nitride layer.

17. The integrated circuit of claim 16, wherein the copper layer comprises a copper seed layer formed by physical vapor deposition and a bulk copper layer formed on the copper seed layer by plating.

18. The integrated circuit of claim 16, further comprising a through-silicon-via (TSV) feature configured in the substrate, the TSV feature being adjacent the conductive pad and coupled with the conductive pad.

\* \* \* \* \*